United States Patent
Zhang et al.

(10) Patent No.: US 11,882,716 B2
(45) Date of Patent: Jan. 23, 2024

(54) DISPLAY PANEL, METHOD FOR MANUFACTURING SAME, AND DISPLAY APPARATUS

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Yang Zhang, Beijing (CN); Ning Liu, Beijing (CN); Bin Zhou, Beijing (CN); Leilei Cheng, Beijing (CN); Liangchen Yan, Beijing (CN); Jun Liu, Beijing (CN); Qinghe Wang, Beijing (CN); Tao Sun, Beijing (CN); Zhiwen Luo, Beijing (CN)

(73) Assignees: HEFEI XINSHENG OPTOELECTRONICS TECHNOLOGY CO., LTD., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 65 days.

(21) Appl. No.: 17/336,523

(22) Filed: Jun. 2, 2021

(65) Prior Publication Data

US 2022/0093893 A1 Mar. 24, 2022

(30) Foreign Application Priority Data

Sep. 23, 2020 (CN) .......................... 202011011841.4

(51) Int. Cl.
*H10K 50/824* (2023.01)
*H10K 50/84* (2023.01)
(Continued)

(52) U.S. Cl.
CPC ......... *H10K 50/824* (2023.02); *H10K 50/814* (2023.02); *H10K 50/84* (2023.02); *H10K 59/122* (2023.02); *H10K 71/00* (2023.02)

(58) Field of Classification Search
None
See application file for complete search history.

(56) References Cited

U.S. PATENT DOCUMENTS

| 2016/0013438 A1* | 1/2016 | Im ...................... H10K 59/1315 |
| | | 257/762 |
| 2017/0005158 A1* | 1/2017 | Yeo ...................... H10K 50/826 |
| 2021/0083190 A1 | 3/2021 | Qu et al. |

FOREIGN PATENT DOCUMENTS

| CN | 105261632 A | 1/2016 |
| CN | 110047893 A | 7/2019 |

(Continued)

OTHER PUBLICATIONS

China National Intellectual Property Administration, First office action of Chinese application No. 202011011841.4 dated Mar. 28, 2022, which is foreign counterpart application of this US application.

*Primary Examiner* — Michelle Mandala
(74) *Attorney, Agent, or Firm* — Lippes Mathias LLP

(57) ABSTRACT

A method for manufacturing a display panel includes: sequentially forming a conductive pattern, a light-emitting layer and a cathode layer on a substrate. The conductive pattern is formed by a one-time patterning process, and includes an auxiliary electrode layer. In a direction parallel to the substrate, both the first protective electrode and the second protective electrode in the auxiliary electrode layer extend over the metal electrode, a second orthographic projection of the second protective electrode on the substrate is within a first orthographic projection of the first protective electrode on the substrate, and an outer boundary of the (Continued)

second orthographic projection is staggered from an outer boundary of the first orthographic projection. The cathode layer is in contact with the first protective electrode and a sidewall of the metal electrode.

19 Claims, 9 Drawing Sheets

(51) Int. Cl.
*H10K 50/814* (2023.01)
*H10K 59/122* (2023.01)
*H10K 71/00* (2023.01)

(56) References Cited

FOREIGN PATENT DOCUMENTS

| | | |
|---|---|---|
| CN | 110571361 A | 12/2019 |
| CN | 110911461 A | 3/2020 |
| JP | 2008135325 A | 6/2008 |
| KR | 20160006110 A | 1/2016 |
| KR | 20170003804 A | 1/2017 |

* cited by examiner

DISPLAY PANEL, METHOD FOR MANUFACTURING SAME, AND DISPLAY APPARATUS

CROSS-REFERENCE TO RELATED APPLICATION

This application claims priority to Chinese Patent Application No. 202011011841.4, filed on Sep. 23, 2020 and entitled "DISPLAY PANEL, METHOD FOR MANUFACTURING SAME, AND DISPLAY APPARATUS", the disclosure of which is herein incorporated by reference in its entirety.

TECHNICAL FIELD

The present disclosure relates to the field of display technologies, and in particular, to a display panel, a method for manufacturing the same and a display apparatus.

BACKGROUND

Currently, an organic light-emitting diode (OLED) display panel generally includes an anode layer, an organic light-emitting layer and a cathode layer. Based on different light-emitting surfaces, the OLED display panels are divided into bottom-emitting OLED display panels and top-emitting OLED display panels. The top-emitting OLED display panels can have a higher aperture ratio, and become a research hotspot in recent years.

SUMMARY

Embodiments of the present disclosure provide a display panel, a method for manufacturing the same and a display apparatus. The technical solutions are as follows.

In an aspect, a method for manufacturing a display panel is provided. The method includes: forming a conductive pattern on a substrate by a one-time patterning process, wherein the conductive pattern includes an auxiliary electrode layer, the auxiliary electrode layer includes a first protective electrode, a metal electrode and a second protective electrode which are laminated in a direction that is perpendicular to and away from the substrate, the first protective electrode and the second protective electrode both extend over the metal electrode in a direction parallel to the substrate, a second orthographic projection of the second protective electrode on the substrate is within a first orthographic projection of the first protective electrode on the substrate, and an outer boundary of the second orthographic projection is staggered from an outer boundary of the first orthographic projection; forming a light-emitting layer on the conductive pattern; and forming a cathode layer on the light-emitting layer, wherein the cathode layer is in contact with the first protective electrode and is in contact with a sidewall of the metal electrode.

Optionally, forming the conductive pattern on the substrate by the one-time patterning process includes: sequentially forming a first conductive film, a second conductive film, and a third conductive film on the substrate; forming a first photoresist pattern on the third conductive film; acquiring a first conductive sub-pattern by performing a first etching process on the third conductive film; acquiring a second conductive sub-pattern by performing a second etching process on the second conductive film; acquiring a second photoresist pattern by performing an ashing process on the first photoresist pattern to remove an edge portion in the first photoresist pattern; acquiring a third conductive sub-pattern by performing a third etching process on the first conductive sub-pattern, wherein the third conductive sub-pattern includes the second protective electrode; acquiring a fourth conductive sub-pattern by performing a fourth etching process on the first conductive film, wherein the fourth conductive sub-pattern includes the first protective electrode; and acquiring a fifth conductive sub-pattern by performing an over-etching process on the second conductive sub-pattern, wherein the fifth conductive sub-pattern includes the metal electrode.

Optionally, acquiring the second photoresist pattern by performing the ashing process on the first photoresist pattern to remove the edge portion of the first photoresist pattern includes: acquiring the second photoresist pattern by placing the substrate on which the first photoresist pattern is formed in an environment containing an ashing gas, such that the ashing gas reduces a thickness of the first photoresist pattern and removes the edge portion of the first photoresist pattern, wherein the ashing gas is used to react with a photoresist material in the first photoresist pattern.

Optionally, the ashing gas includes any one of the followings: oxygen; and a mixed gas of oxygen and sulfur hexafluoride.

Optionally, the conductive pattern further includes an anode layer, which includes a first sub-anode, a second sub-anode and a third sub-anode which are sequentially laminated in a direction away from the substrate; and before acquiring the fifth conductive sub-pattern by performing an over-etching process on the second conductive sub-pattern, the method further includes: removing the second photoresist pattern; and forming a pixel-defining layer on the third conductive sub-pattern, wherein the fourth conductive sub-pattern further includes the first sub-anode, the second conductive sub-pattern includes the second sub-anode, the third conductive sub-pattern further includes the third sub-anode, a third orthographic projection of the third sub-anode on the substrate is within a fourth orthographic projection of the second sub-anode on the substrate, and an outer boundary of the third orthographic projection is staggered from an outer boundary of the fourth orthographic projection; and the pixel-defining layer at least covers a portion of the second sub-anode that is not in contact with the third sub-anode, and the pixel-defining layer is staggered from the auxiliary electrode layer.

Optionally, forming the first photoresist pattern on the third conductive film includes: forming a photoresist film on the third conductive film; and acquiring the first photoresist pattern by exposing and developing the photoresist film.

Optionally, forming the cathode layer on the light-emitting layer includes: forming the cathode layer on the light-emitting layer by a sputtering process.

Optionally, forming the light-emitting layer on the conductive pattern includes: forming the light-emitting layer on the conductive pattern by an evaporation process.

Optionally, after forming the cathode layer on the light-emitting layer, the method further includes: forming an encapsulation layer on the cathode layer.

In another aspect, a display panel is provided. The display panel includes: a substrate; and a conductive pattern, a light-emitting layer and a cathode layer which are laminated on the substrate in a direction that is perpendicular to and away from the substrate, wherein the conductive pattern is formed by a one-time patterning process, the conductive pattern includes an auxiliary electrode layer, the auxiliary electrode layer includes a first protective electrode, a metal electrode and a second protective electrode which are laminated in a direction that is perpendicular to and away from the substrate, the first protective electrode and the second protective electrode both extend over the metal electrode in a direction parallel to the substrate, a second orthographic projection of the second protective electrode on the substrate is within a first orthographic projection of the first protective electrode on the substrate, and an outer boundary of the second orthographic projection is staggered from an outer boundary of the first orthographic projection; and the cathode layer is in contact with the first protective electrode and is in contact with a sidewall of the metal electrode.

Optionally, the conductive pattern further includes an anode layer, which includes a first sub-anode, a second sub-anode and a third sub-anode which are sequentially laminated in a direction perpendicular to and away from the substrate; wherein a material of the first sub-anode is the same as a material of the first protective electrode, a material of the second sub-anode is the same as a material of the metal electrode, and a material of the third sub-anode is the same as a material of the second protective electrode.

Optionally, a third orthographic projection of the third sub-anode on the substrate is within a fourth orthographic projection of the second sub-anode on the substrate, and an outer boundary of the third orthographic projection is staggered from an outer boundary of the fourth orthographic projection.

Optionally, the display panel further includes a pixel-defining layer. The pixel-defining layer at least covers a portion of the second sub-anode that is not in contact with the third sub-anode, and the pixel-defining layer is staggered from the auxiliary electrode layer.

Optionally, the pixel-defining layer further covers an edge portion of the third sub-anode.

Optionally, the third orthographic projection is within a central region of the fourth orthographic projection, and an outer boundary of a fifth orthographic projection of the first sub-anode on the substrate coincides with the outer boundary of the fourth orthographic projection.

Optionally, the second orthographic projection is within a central region of the first orthographic projection, and a sixth orthographic projection of the metal electrode on the substrate is within the central region of the first orthographic projection.

Optionally, a material of the first protective electrode and a material of the second protective electrode both include: indium tin oxide or indium zinc oxide.

Optionally, the substrate includes: a pixel drive circuit electrically connected to the anode layer, and a cathode signal line electrically connected to the auxiliary electrode layer.

Optionally, the display panel further includes: an encapsulation layer disposed on a side of the cathode layer away from the substrate.

In still another aspect, a display apparatus is provided. The display apparatus includes: a power supply component and a display panel, wherein the power supply component is configured to supply power to the display panel, and the display panel includes: a substrate; and a conductive pattern, a light-emitting layer and a cathode layer which are laminated on the substrate in a direction that is perpendicular to and away from the substrate, wherein the conductive pattern is formed by a one-time patterning process, the conductive pattern includes an auxiliary electrode layer, the auxiliary electrode layer includes a first protective electrode, a metal electrode and a second protective electrode which are laminated in a direction that is away from the substrate, the first protective electrode and the second protective electrode both extend over the metal electrode in a direction parallel to the substrate, a second orthographic projection of the second protective electrode on the substrate is within a first orthographic projection of the first protective electrode on the substrate, and an outer boundary of the second orthographic projection is staggered from an outer boundary of the first orthographic projection; and the cathode layer is in contact with the first protective electrode and is in contact with a sidewall of the metal electrode.

BRIEF DESCRIPTION OF THE DRAWINGS

For clearer descriptions of the technical solutions in the embodiments of the present disclosure, the following briefly introduces the accompanying drawings required for describing the embodiments. Apparently, the accompanying drawings in the following description show merely some embodiments of the present disclosure, and persons of ordinary skill in the art may still derive other drawings from these accompanying drawings without creative efforts.

DETAILED DESCRIPTION

For clearer descriptions of the objectives, technical solutions, and advantages of the present disclosure, embodiments of the present disclosure are further described in detail hereinafter with reference to the accompanying drawings.

To increase light transmittance, the top-emitting OLED display panel needs to be provided with a thin and transparent cathode layer, and an anode layer capable of reflecting light. While, the thin and transparent cathode layer usually has problems such as high resistance and great voltage drop (IR drop). Generally, the farther a position in the cathode layer is away from a power supply point, the more significant the voltage drop at the position is, thereby leading to obvious uneven light emission of the OLED display panel.

Currently, an auxiliary electrode layer, an organic light-emitting layer, and a cathode layer may be sequentially formed during forming an OLED display panel. The auxiliary electrode layer is electrically connected to the cathode layer, and a power supply may provide electrical signals to the auxiliary electrode layer. Voltages at positions in the cathode layer may be made the same by means of the auxiliary electrode layer, thereby overcoming the problem of the great voltage drop in the cathode layer in the OLED display panel.

However, the organic light-emitting layer is usually formed by an evaporation process. During forming the organic light-emitting layer by the evaporation process, it's easy for the organic light-emitting layer to be attached to the auxiliary electrode layer, which affects the electrical connection between the auxiliary electrode layer and the cathode layer formed subsequently, thereby leading to a poor display effect of the OLED display panel.

Figure 1:
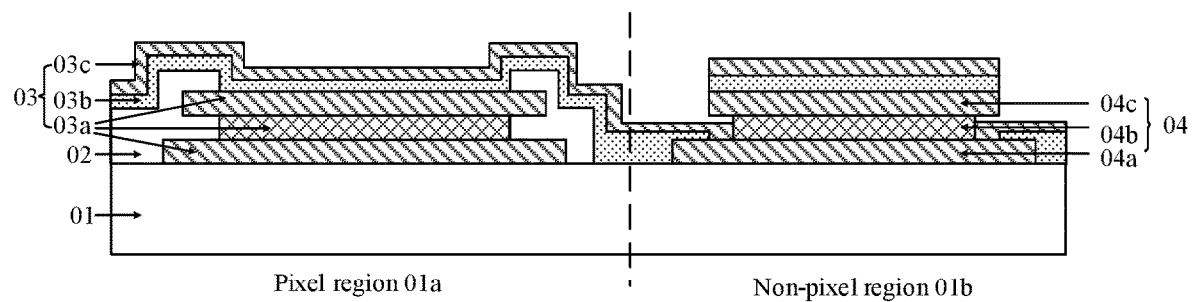
FIG. 1 is a schematic diagram of a film layer structure of an OLED display panel in the related art.

Please refer to FIG. 1, which is a schematic diagram of a film layer structure of a common OLED display panel at present. The OLED display panel may include: a substrate 01, as well as a pixel-defining layer 02, an OLED light-emitting device 03 and an auxiliary electrode layer 04 which are disposed on the substrate 01. The pixel-defining layer 02 is configured to define a pixel region 01*a* and a non-pixel region 01*b* outside the pixel region 01*a* on the substrate 01.

The OLED light-emitting device 03 may be disposed in the pixel region 01*a*. The OLED light-emitting device 03 may include: an anode layer 03*a*, an organic light-emitting layer 03*b*, and a cathode layer 03*c*, which are laminated.

The auxiliary electrode layer 04 may be disposed in the non-pixel region 01*b*. The auxiliary electrode layer 04 may include: a first protective electrode 04*a*, a metal electrode 04*b*, and a second protective electrode 04*c*, which are laminated in a direction that is perpendicular to and away from the substrate 01. The first protective electrode 04*a* and the second protective electrode 04*c* both extend over the metal electrode 04 in a direction parallel to the substrate 01. Since the second protective electrode 04*c* extends over the metal electrode 04*b* in the direction parallel to the substrate 01, when the light-emitting layer 03*b* is formed on the second protective electrode 04*c* through evaporation, the light-emitting layer 03*b* is attached to the second protective electrode 04*c*, but is not attached to the metal electrode 04*b*. Therefore, when the cathode layer 03*c* in the light-emitting device 03 is formed on the light-emitting layer 03*b*, the cathode layer 03*c* may extend to the non-pixel region 01*b* and come into contact the sidewall of the metal electrode 04*b*.

To ensure the electrical connection performance between the cathode layer 03*c* and the auxiliary electrode layer 04, the overlapping area between the cathode layer 03*c* and the auxiliary electrode layer 04 needs to be increased. Therefore, in the auxiliary electrode layer 04, an orthographic projection of the second protective electrode 04*c* on the substrate 01 needs to be within an orthographic projection of the first protective electrode 04*a* on the substrate 01, and an outer boundary of the orthographic projection of the second protective electrode 04*c* on the substrate 01 needs to be staggered from an outer boundary of the orthographic projection of the first protective electrode 04*a* on the substrate 01. That is, the area of the orthographic projection of the first protective electrode 04*a* on the substrate 01 is larger than the area of the orthographic projection of the second protective electrode 04*c* on the substrate 01. As such, the cathode layer 03*c* may also be in contact with the first protective electrode 04*a*, such that the contact area between the cathode layer 03*c* and the auxiliary electrode layer 04 is larger, thereby improving the electrical connection performance between the cathode layer 03*c* and the auxiliary electrode layer 04.

However, when the area of the orthographic projection of the first protective electrode 04*a* on the substrate 01 is larger than the area of the orthographic projection of the second protective electrode 04*c* on the substrate 01, the auxiliary electrode layer 04 needs to be formed by at least two patterning processes. For example, to form the auxiliary electrode layer 04 on the substrate 01, the first protective electrode 04*a* in the auxiliary electrode layer 04 may be formed first by one patterning process, and the metal electrode 04*b* and the second protective electrode 04*c* in the auxiliary electrode layer 04 may be formed by another patterning process.

Masks are required in each patterning process, and different masks are used in different patterning processes. The cost in developing and manufacturing the masks is usually high. Therefore, least two masks are required in the process of manufacturing the auxiliary electrode layer 04. The process of manufacturing the auxiliary electrode layer 04 is relatively complicated, which leads to a great difficulty in manufacturing the OLED display panel.

Figure 2:
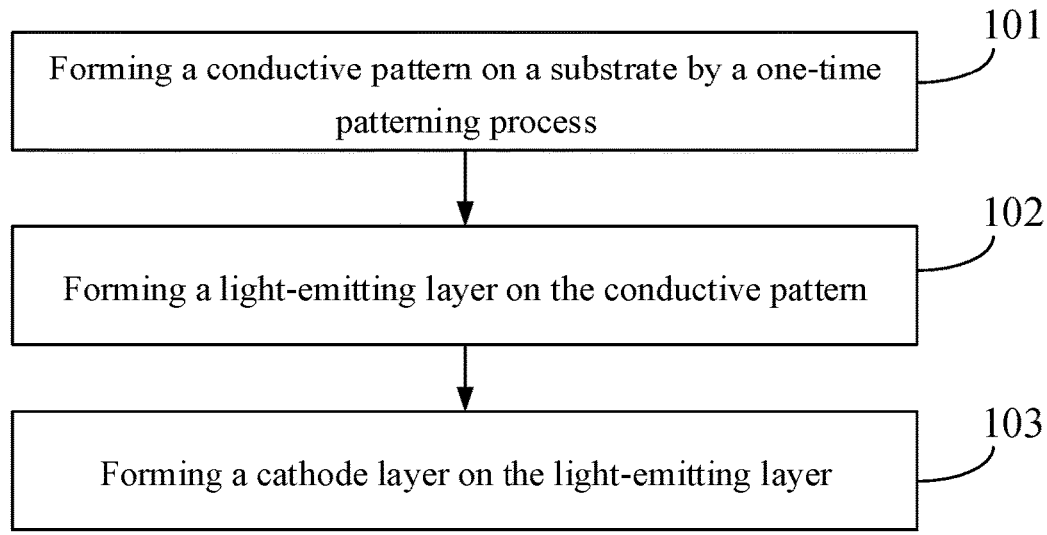
FIG. 2 is a flowchart of a method for manufacturing a display panel according to an embodiment of the present disclosure.

Please refer to FIG. 2, which is a flowchart of a method for manufacturing a display panel according to an embodiment of the present disclosure. The method may include the following steps.

In step 101, a conductive pattern is formed on a substrate by a one-time patterning process.

The conductive pattern includes: an auxiliary electrode layer. The auxiliary electrode layer includes: a first protective electrode, a metal electrode, and a second protective electrode, which are laminated in a direction that is perpendicular to and away from the substrate. The first protective electrode and the second protective electrode both extend over the metal electrode in a direction parallel to the substrate. A second orthographic projection of the second protective electrode on the substrate is within a first orthographic projection of the first protective electrode on the substrate, and an outer boundary of the second orthographic projection is staggered from an outer boundary of the first orthographic projection.

In step 102, a light-emitting layer is formed on the conductive pattern.

In step 103, a cathode layer is formed on the light-emitting layer. The cathode layer is in contact with the first protective electrode and a sidewall of the metal electrode. It should be noted that the metal electrode has an upper surface and a lower surface in a direction parallel to the substrate, and the sidewall of the metal electrode is connected to the upper surface and the lower surface.

In summary, the method for manufacturing the display panel according to the present embodiment includes: sequentially forming a conductive pattern, a light-emitting layer, and a cathode layer on the substrate. The conductive pattern may include an auxiliary electrode layer, and the auxiliary electrode layer includes: a first protective electrode, a metal electrode and a second protective electrode which are laminated in the direction that is perpendicular to and away from the substrate. The second protective electrode and the first protective electrode both extend over the metal electrode in the direction parallel to the substrate. Therefore, when the light-emitting layer is formed on the second protective electrode, the light-emitting layer is only attached to the second protective electrode and the edge area of the first protective electrode, so that the cathode layer subsequently formed may be in contact with the sidewall of the metal electrode and the first protective electrode. Thus, effective overlapping between the cathode layer and the auxiliary electrode layer can be achieved, thereby avoiding that the cathode layer and the auxiliary electrode layer cannot be overlapped normally due to the attachment of the light-emitting layer to the auxiliary electrode layer. The electrical connection performance between the cathode layer and the auxiliary electrode layer is effectively improved, so that the display panel achieves a better display effect. In addition, as the auxiliary electrode layer is formed by the one-time patterning process, only one mask is required in the process of forming the auxiliary electrode layer, which effectively reduces the cost in developing and manufacturing masks. Therefore, the manufacturing process of the auxiliary electrode layer is effectively simplified and the difficulty in manufacturing the display panel is reduced.

Figure 3:
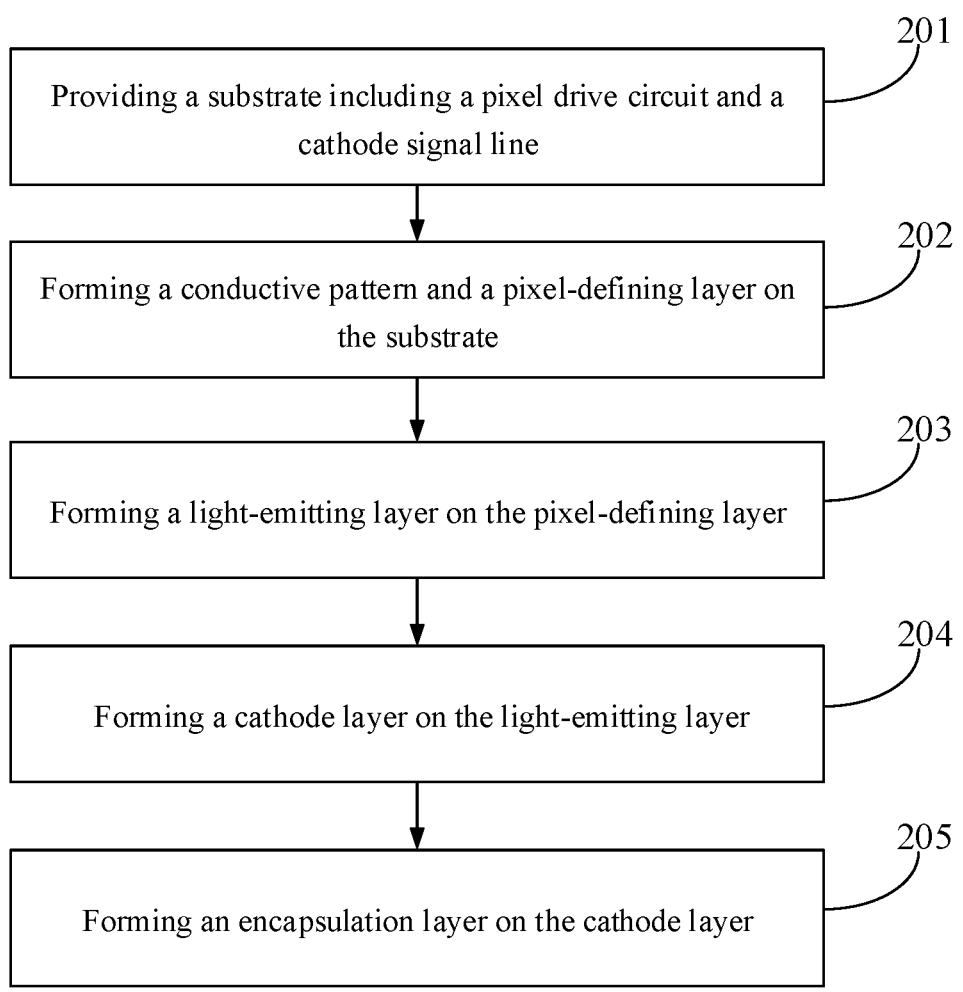
FIG. 3 is a flowchart of another method for manufacturing a display panel according to an embodiment of the present disclosure.

Please refer to FIG. 3, which is a flowchart of another method for manufacturing a display panel according to an embodiment of the present disclosure. The method may include the following steps.

In step 201, a substrate including a pixel drive circuit and a cathode signal line is provided.

Figure 4:
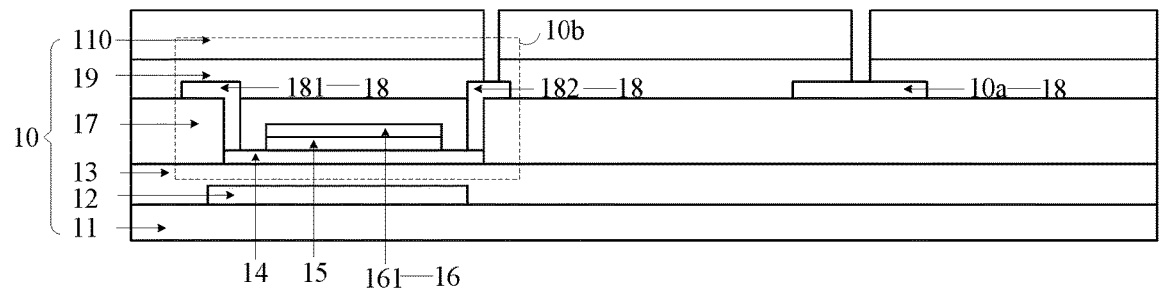
FIG. 4 is a schematic diagram of a film layer structure of a substrate according to an embodiment of the present disclosure.

In an exemplary embodiment, as shown in FIG. 4, which is a schematic diagram of a film layer structure of a substrate according to an embodiment of the present disclosure, the substrate 10 may include: a base 11, as well as a light-shielding layer pattern 12, a buffer layer 13, an active layer pattern 14, a gate insulating layer pattern 15, a gate pattern 16, an intermediate insulating layer 17, a source/drain pattern 18, a passivation layer 19, and a planarization layer 110, which are laminated on the base 11 in a direction that is perpendicular to and away from the base 11.

In the present disclosure, providing the substrate including the pixel drive circuit and the cathode signal line may include the following processes.

First, a light-shielding material film is formed on the base 11, and a one-time patterning process is performed on the light-shielding material film to form the light-shielding layer pattern 12. Optionally, materials of the light-shielding layer pattern 12 may include a metallic material, such as metallic aluminum, metallic silver, metallic molybdenum, and an alloy. The light shielding layer pattern 12 is configured to shield the active layer pattern 14, so as to prevent the active layer pattern 14 from voltage threshold deviation under the irradiation of light.

Afterwards, a buffer layer 13 is formed on the base 11 on which the light-shielding layer pattern 12 is formed. Optionally, materials of the buffer layer 13 may include an inorganic material, such as silicon nitride, silicon oxide, and silicon oxynitride. In the present disclosure, the buffer layer 13 has a thickness in a range of 0.6-3 microns. The buffer layer 13 is configured to block ions in the base 11 from entering the active layer pattern 14, thereby preventing the performance of the active layer pattern 14 from being affected by the ions entering the active layer pattern 14.

Afterwards, an active material film is formed on the base 11 on which the buffer layer 13 is formed, and a one-time patterning process is performed on the active material film to form the active layer pattern 14. Optionally, materials of the active layer pattern 14 may include a semiconductor material, such as polysilicon, amorphous silicon, and oxide semiconductors.

Afterwards, a gate insulating film and a gate layer are formed on the base 11 on which the active layer pattern 14 is formed, and the gate insulating layer pattern 15 and the gate pattern 16 are formed by performing a one-time patterning process on the gate layer. The gate pattern may include: a gate 161 and a gate line (not shown in FIG. 4) connected to the gate 161. Optionally, materials of the gate insulating layer pattern 15 may include silicon dioxide, silicon nitride, or a mixed material of silicon dioxide and silicon nitride, and materials of the gate pattern 16 may include a metallic material, such as metallic aluminum, metallic silver, metallic molybdenum or an alloy. The gate line is configured to apply a gate voltage to the gate 161.

Afterwards, an intermediate insulating film is formed on the base 11 on which the gate pattern 16 is formed, and the intermediate insulating layer 17 is formed by performing a one-time patterning process on the intermediate insulating film. The intermediate insulating layer 17 is provided with a first via hole, through which the source 181 and drain 182 that are subsequently formed may be both overlapped with the active layer pattern 14. Optionally, materials of the intermediate insulating layer 17 may include silicon dioxide, silicon nitride, or a mixed material of silicon dioxide and silicon nitride.

Afterwards, a source/drain material layer is formed on the base 11 on which the intermediate insulating layer 17 is formed, and the source/drain pattern 18 is formed by performing a one-time patterning process on the source/drain material layer. The source/drain pattern 18 may include: a source 181, a drain 182, a cathode signal line 10a, and a data line (not shown in FIG. 4). Optionally, materials of the source/drain pattern 18 may include a metallic material, such as metallic aluminum, metallic silver, metallic molybdenum, or an alloy.

The data line may be electrically connected to one of the source 181 and the drain 182, and the other of the source 181 and the drain 182 may be electrically connected to a anode layer which is subsequently formed. In the present disclosure, the drain 182 may be electrically connected to the anode layer which is subsequently formed, and the source 181 needs to be electrically connected to the data line. The cathode signal line 10a is configured to be electrically connected to the auxiliary electrode layer which is subsequently formed.

It should be noted that the gate 161, the active layer pattern 14, the source 181, and the drain 182 and the like can constitute the pixel drive circuit 10b in the above-mentioned embodiment.

Finally, a passivation film and a planarization film are formed on the base 11 on which the source/drain pattern 18 is formed, and the passivation layer 19 and the planarization layer 110 are formed by performing the one-time patterning process on the planarization film. The passivation layer 19 is provided with a second via hole, and the planarization layer 110 is provided with a third via hole which is communicated with the second via hole. Through the second and third via holes that are communicated with each other, the subsequently formed anode layer may be overlapped with the drain 182.

It should be noted that the substrate 10 including the cathode signal line 10a and the pixel drive circuit 10b may be formed through the above-mentioned processes. It should also be noted that the one-time patterning process in the above-mentioned embodiment may include: photoresist coating, exposure, developing, etching, and photoresist stripping.

In step 202, a conductive pattern and a pixel-defining layer are formed on the substrate.

In the embodiment of the present disclosure, the conductive pattern includes: an anode layer and an auxiliary electrode layer.

The auxiliary electrode layer may include: a first protective electrode, a metal electrode and a second protective electrode, which are laminated in a direction that is perpendicular to and away from the substrate. The first protective electrode and the second protective electrode both extend over the metal electrode in the direction parallel to the substrate. A second orthographic projection of the second protective electrode on the substrate is within a first orthographic projection of the first protective electrode on the substrate, and an outer boundary of the second orthographic projection is staggered from an outer boundary of the first orthographic projection.

The anode layer may include: a first sub-anode, a second sub-anode, and a third sub-anode which are laminated in the direction that is perpendicular to and away from the substrate. The first sub-anode may be made of the same material as the first protective electrode, the second sub-anode may be made of the same material as the metal electrode, and the third sub-anode may be made of the same material as the second protective electrode.

Optionally, the pixel-defining layer may cover an edge portion of the anode layer, and needs to be staggered from the auxiliary electrode layer.

It should be noted that the anode layer in the conductive pattern may be of various structures. Therefore, there may be various implementations to form the conductive pattern and the pixel-defining layer on the substrate. This embodiment of the present disclosure is illustrated by taking the following two optional implementations as an example.

In a first optional implementation, forming the conductive pattern and the pixel-defining layer on the substrate may include the following steps.

In step A1, a first conductive film, a second conductive film, and a third conductive film are sequentially formed on the substrate.

Optionally, materials of the first conductive film and the third conductive film may include a transparent conductive material, such as indium tin oxide (ITO) or indium zinc oxide (IZO). The material of the second conductive film may include a metallic material, such as metallic aluminum, metallic molybdenum, metallic silver, or an alloy.

Figure 5:
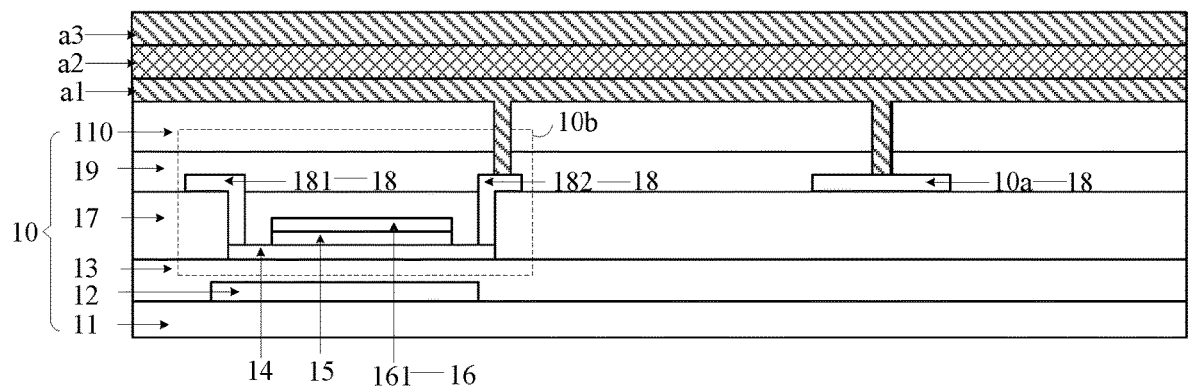
FIG. 5 is a schematic diagram illustrating formation of a first conductive film, a second conductive film and a third conductive film according to an embodiment of the present disclosure.

In an exemplary embodiment, referring to FIG. 5, it is a schematic diagram illustrating formation of the first conductive film, the second conductive film and the third conductive film according to an embodiment of the present disclosure. The first conductive film a1, the second conductive film a2, and the third conductive film a3 may be sequentially formed on the substrate 10 by any one of deposition, coating, sputtering and the like.

In step B1, a first photoresist pattern is formed on the third conductive film.

Figure 6:
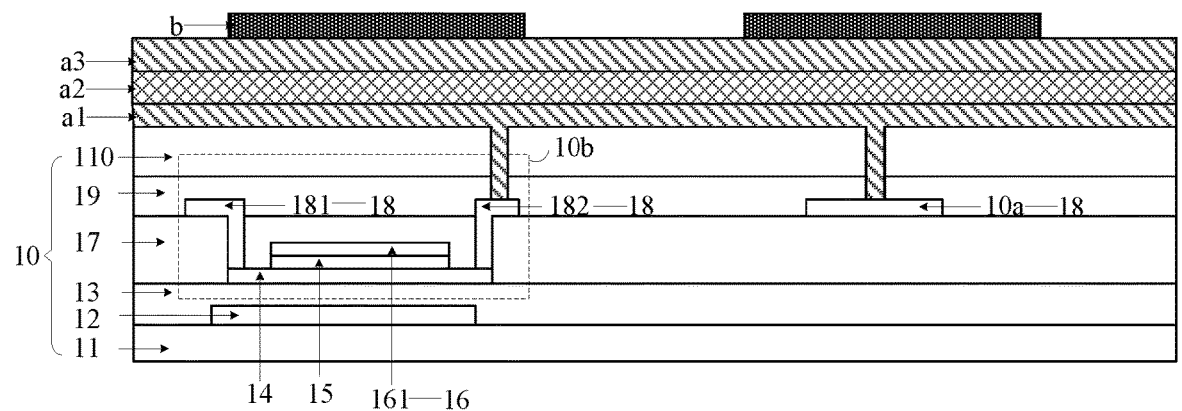
FIG. 6 is a schematic diagram illustrating formation of a first photoresist pattern according to an embodiment of the present disclosure.

In an exemplary embodiment, referring to FIG. 6, it is a schematic diagram illustrating formation of the first photoresist pattern according to an embodiment of the present disclosure. Forming the first photoresist pattern on the third conductive film may include the following processes.

First, a photoresist film may be formed on the third conductive film a3. For example, the photoresist film may be formed by coating on the third conductive film a3.

Then, a first photoresist pattern b may be acquired by exposing and developing the photoresist film. In an exemplary embodiment, a mask may be used to perform exposure on the photoresist film, and afterwards the exposed photoresist film may be developed to acquire the first photoresist pattern b.

In step C1, a first conductive sub-pattern is acquired by performing a first etching process on the third conductive film.

Figure 7:
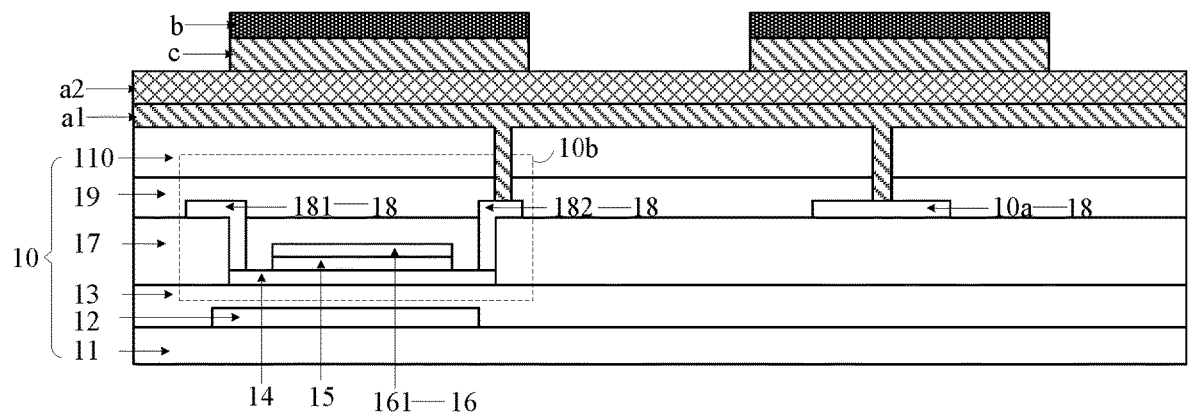
FIG. 7 is a schematic diagram illustrating formation of a first conductive sub-pattern according to an embodiment of the present disclosure.

Referring to FIG. 7, it is a schematic diagram illustrating the formation of the first conductive sub-pattern according to an embodiment of the present disclosure. The first conductive sub-pattern c may be formed by performing the first etching process on the third conductive film with the first photoresist pattern b.

In an exemplary embodiment, an etching solution for etching a transparent conductive material may be used to perform the first etching process on the third conductive film to remove portions, not covered by the first photoresist pattern b, of the third conductive film, thereby forming the first conductive sub-pattern c with the first photoresist pattern b.

An outer boundary of an orthographic projection of the first conductive sub-pattern c on the substrate 10 may coincide with an outer boundary of an orthographic projection of the first photoresist pattern b on the substrate 10.

In step D1, a second conductive sub-pattern is acquired by performing a second etching process on the second conductive film.

Figure 8:
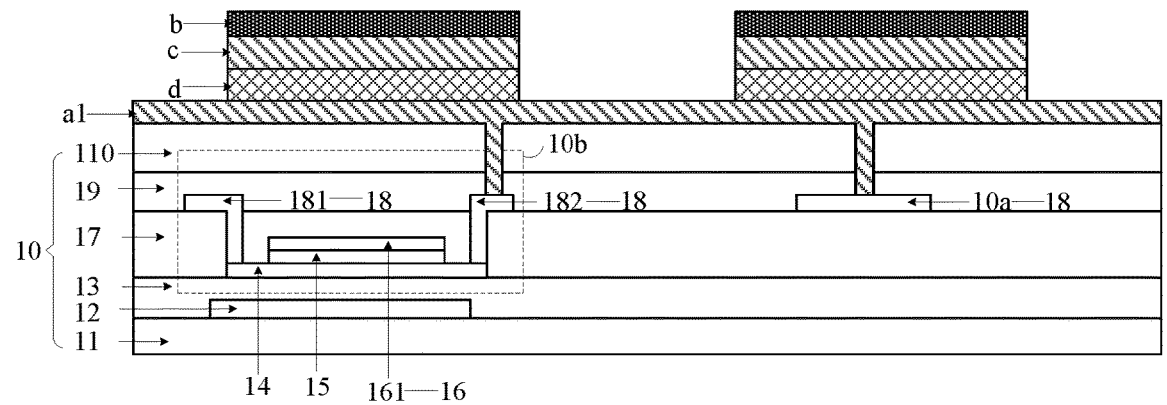
FIG. 8 is a schematic diagram illustrating formation of a second conductive sub-pattern according to an embodiment of the present disclosure.

Referring to FIG. 8, it is a schematic diagram illustrating the formation of the second conductive sub-pattern according to an embodiment of the present disclosure. The second conductive sub-pattern d may be formed by performing the second etching process on the second conductive film with the first conductive sub-pattern c.

In an exemplary embodiment, an etching solution for etching a metallic material may be used to perform the second etching process on the second conductive film to remove portions, not covered by the first conductive sub-pattern c, of the second conductive film, thereby forming the second conductive sub-pattern d with the first conductive sub-pattern c.

The outer boundary of the orthographic projection of the second conductive sub-pattern d on the substrate 10 may coincide with the outer boundary of the orthographic projection of the first conductive sub-pattern c on the substrate 10. In other possible implementations, the outer boundary of the orthographic projection of the second conductive sub-pattern d on the substrate 10 may or may not coincide with the outer boundary of the orthographic projection of the first conductive sub-pattern c on the substrate 10, but the distance between the boundaries of the two is small when the outer boundary of the orthographic projection of the second conductive sub-pattern d on the substrate 10 does not coincide with the outer boundary of the orthographic projection of the first conductive sub-pattern c on the substrate 10.

In step E1, a second photoresist pattern is acquired by performing an ashing process on the first photoresist pattern to remove an edge portion in the first photoresist pattern.

Figure 9:
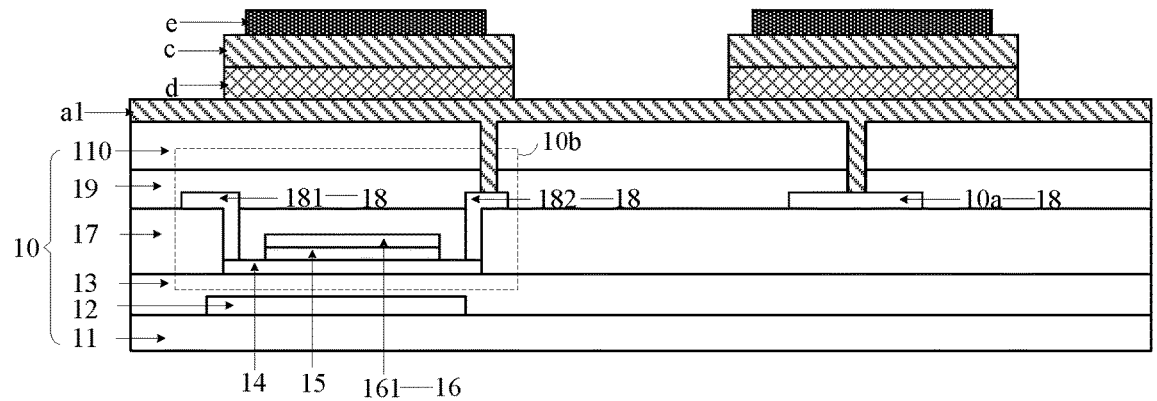
FIG. 9 is a schematic diagram illustrating formation of a second photoresist pattern according to an embodiment of the present disclosure.

Referring to FIG. 9, it is a schematic diagram illustrating the formation of the second photoresist pattern according an embodiment of the present disclosure. The second photoresist pattern e is acquired by performing the ashing process the first photoresist pattern to remove the edge portion in the first photoresist pattern.

In an exemplary embodiment, step E1 may include: acquiring the second photoresist pattern e by placing the substrate 10 on which the first photoresist pattern is formed in an environment containing an ashing gas, so that the ashing gas reduces the thickness of the first photoresist pattern and removes the edge portion of the first photoresist pattern. The ashing gas is used to react with a photoresist material. The ashing gas may react with the photoresist material in the first photoresist pattern, to remove the edge portion of the first photoresist pattern and reduce the thickness of the first photoresist pattern, thereby acquiring the second photoresist pattern e. For example, the ashing gas may include any one of the followings: oxygen, and a mixed gas of oxygen and sulfur hexafluoride.

It should be noted that in the process of ashing the first photoresist pattern, the duration for which the substrate 10 with the first photoresist pattern is placed in the environment containing the ashing gas may be controlled, to ensure that the photoresist on the substrate 10 is not completely removed by the ashing gas, such that the first photoresist pattern may be processed into the second photoresist pattern e.

In step F1, a third conductive sub-pattern is acquired by performing a third etching process on the first conductive sub-pattern.

Figure 10:
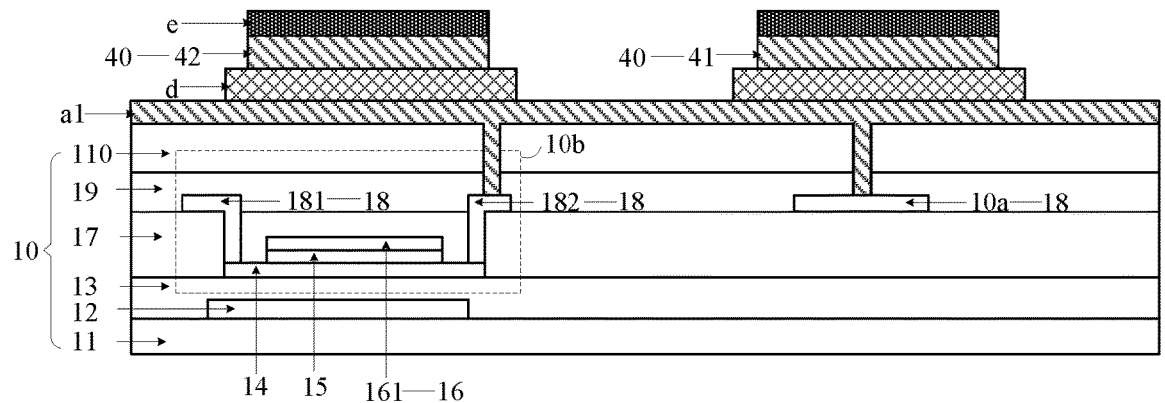
FIG. 10 is a schematic diagram illustrating formation of a third conductive sub-pattern according to an embodiment of the present disclosure.

Please refer to FIG. 10, which is a schematic diagram illustrating formation of the third conductive sub-pattern according to an embodiment of the present disclosure. The third conductive sub-pattern 40 may be formed by performing the third etching process on the first conductive sub-pattern with the second photoresist pattern e.

In an exemplary embodiment, an etching solution for etching a transparent conductive material may be used to perform the third etching process on the first conductive sub-pattern to remove portions, not covered by the second photoresist pattern e, of the first conductive sub-pattern, thereby forming the third conductive sub-pattern 40 with the second photoresist pattern e.

The outer boundary of an orthographic projection of the third conductive sub-pattern 40 on the substrate 10 may coincide with the outer boundary of the orthographic projection of the second photoresist pattern e on the substrate 10. The third conductive sub-pattern 40 may include: a second protective electrode 41 and a third sub-anode 42.

In step G1, a fourth conductive sub-pattern is acquired by performing a fourth etching process on the first conductive film.

Figure 11:
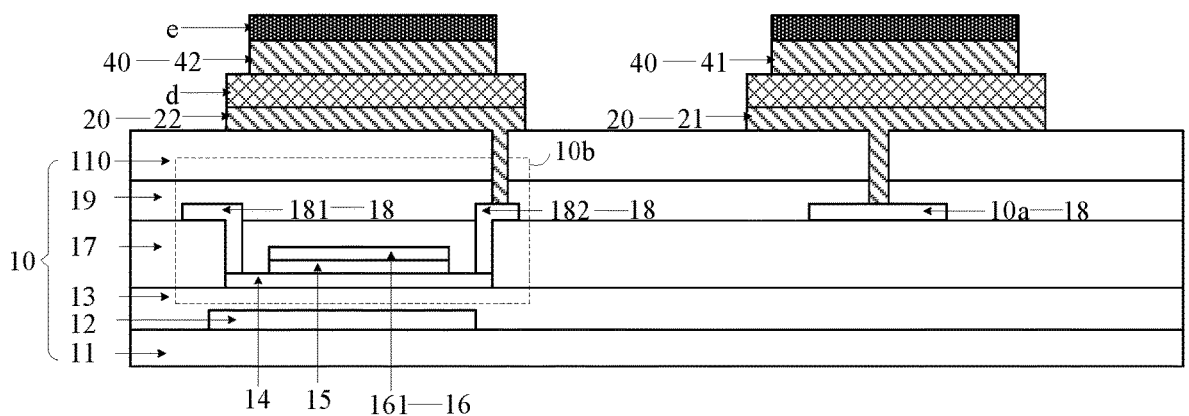
FIG. 11 is a schematic diagram illustrating formation of a fourth conductive sub-pattern according to an embodiment of the present disclosure.

Please refer to FIG. 11, which is a schematic diagram illustrating formation of the fourth conductive sub-pattern according to an embodiment of the present disclosure. The fourth conductive sub-pattern 20 may be formed by performing the fourth etching process on the first conductive film with the second conductive sub-pattern d.

In an exemplary embodiment, an etching solution for etching a transparent conductive material may be used to perform the fourth etching process on the first conductive film to remove portions, not covered by the second conductive sub-pattern d, of the first conductive film, thereby forming the fourth conductive sub-pattern 20 with the second conductive sub-pattern d.

The outer boundary of an orthographic projection of the fourth conductive sub-pattern 20 on the substrate 10 may coincide with the outer boundary of the orthographic projection of the second conductive sub-pattern d on the substrate 10. The fourth conductive sub-pattern 20 may include: a first protective electrode 21 and a first sub-anode 22.

It should be noted that the outer boundary of the orthographic projection of the fourth conductive sub-pattern 20 on the substrate 10 coincides with the outer boundary of the orthographic projection of the second conductive sub-pattern d on the substrate 10. Therefore, the second conductive sub-pattern d may protect the fourth conductive sub-pattern 20 during the process of performing the fourth etching process on the first conductive film, such that the area of the first orthographic projection of the first protective electrode 21 on the substrate 10 is greater than the area of the second orthographic projection of the second protective electrode 41 on the substrate 10, which facilitate the contact between the cathode layer and the auxiliary electrode layer after the cathode layer is formed subsequently.

It should also be noted that since the first conductive film and the third conductive film are made of the same material, the third etching process in step F1 and the fourth etching process in step G1 are the same one. That is, the fourth conductive sub-pattern 20 and the third conductive sub-pattern 40 may be simultaneously acquired through the same etching process.

In step H1, a fifth conductive sub-pattern is acquired by performing an over-etching process on the second conductive sub-pattern.

Figure 12:
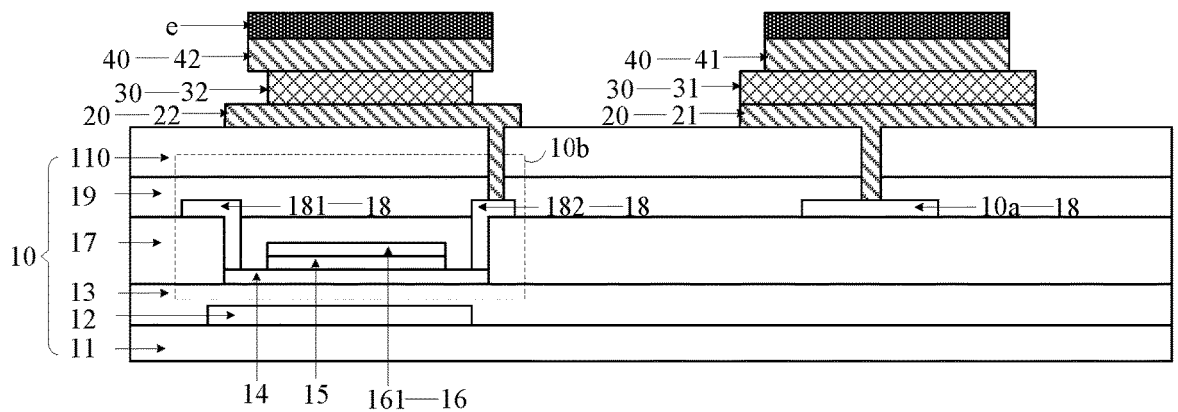
FIG. 12 is a schematic diagram illustrating formation of a fifth conductive sub-pattern according to an embodiment of the present disclosure.

Please refer to FIG. 12, which is a schematic diagram illustrating formation of the fifth conductive sub-pattern according to an embodiment of the present disclosure. An over-etching process may be performed on the second conductive sub-pattern with the third conductive sub-pattern 40, to form the fifth conductive sub-pattern 30.

In an exemplary embodiment, an etching solution for etching a metallic material may be used for etching the second conductive sub-pattern to remove portions, not covered by the third conductive sub-pattern 40, of the second conductive sub-pattern. Afterwards, the etching duration may be increased properly to achieve the over-etching process on the second conductive sub-pattern, to form the fifth conductive sub-pattern 30. The fifth conductive sub-pattern 30 includes: a metal electrode 31 and a second sub-anode 32. As such, the first protective electrode 21 and the second protective electrode 41 both extend over the metal electrode 31 in the direction parallel to the substrate 10.

In step I1, the second photoresist pattern is removed.

Figure 13:
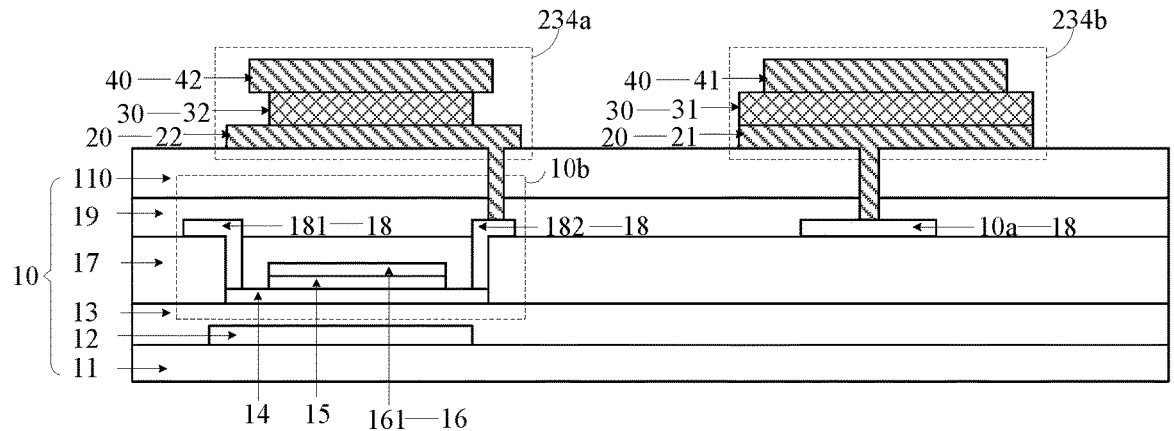
FIG. 13 is a schematic diagram illustrating removal of the second photoresist pattern according to an embodiment of the present disclosure.

Please refer to FIG. 13, which is a schematic diagram illustrating removal of the second photoresist pattern according an embodiment of the present disclosure. An anode layer 234a and an auxiliary electrode layer 234b may be acquired by performing a stripping process on the second photoresist pattern.

It should be noted that a conductive pattern including the anode layer 234a and the auxiliary electrode layer 234b may be formed on the substrate 10 by the above-mentioned steps A1 to I1. The anode layer 234a includes: a first sub-anode 22, a second sub-anode 32 and a third sub-anode 42 which are laminated. The auxiliary electrode layer 234b includes: a first protective electrode 21, a metal electrode 31 and a second protective electrode 41 which are laminated.

In step J1, a pixel-defining layer is formed on the third conductive sub-pattern.

Optionally, the material of the pixel-defining layer may include at least one of: polymers based on polymethyl methacrylate and polystyrene, polymers and derivatives based on phenol group, polymers based on acryl, polymers based on p-xylene, polymers based on aryl ether, polymers based on amide, polymers based on fluoride, and polymers based on vinyl alcohol.

Figure 14:
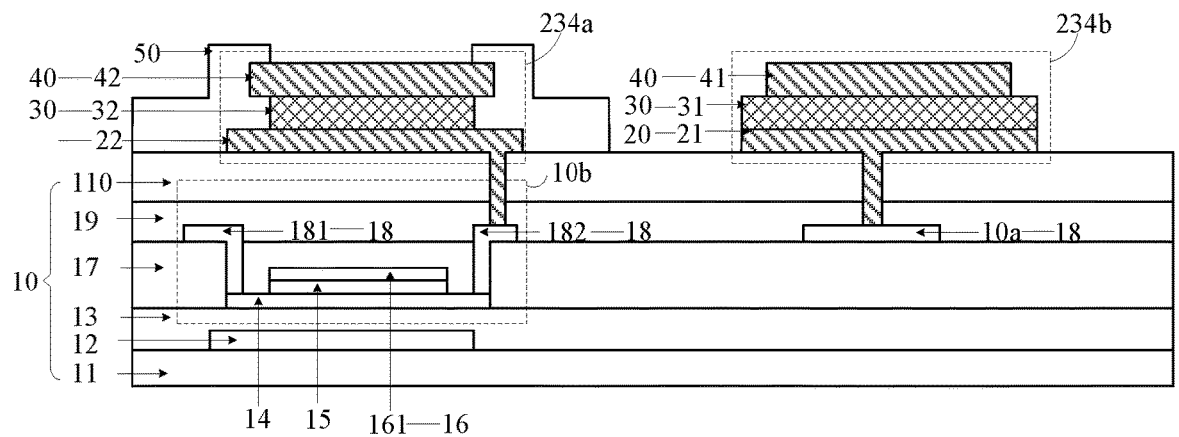
FIG. 14 is a schematic diagram illustrating formation of a pixel-defining layer according to an embodiment of the present disclosure.

Please refer to FIG. 14, which is a schematic diagram illustrating formation of the pixel-defining layer according to an embodiment of the present disclosure. A pixel-defining layer film is formed on the substrate 10 on which the third conductive sub-pattern 40 is formed, by any one of deposition, coating and sputtering and the like, and a one-time patterning process is performed on the pixel-defining layer film, to form the pixel-defining layer 50. The pixel-defining layer covers the edge portion of the anode layer 234a, and is staggered from the auxiliary electrode layer 234b. The one-time patterning process may include: photoresist coating, exposure, developing, etching, and photoresist stripping.

It should be noted that, as shown in FIG. 14, after the conductive pattern and the pixel-defining layer are formed through the above-mentioned steps A1 to J1, in the anode layer 234a, the first sub-anode 22 and the third sub-anode 42 both extend over the second sub-anode 32 in the direction parallel to the substrate 10. Therefore, grooves are formed in the sidewall of the anode layer 234a, resulting in the formation of holes between the pixel-defining layer 50 and the sidewall of the anode layer 234a after the pixel-defining layer 50 is formed, which affects the display effect of the display panel.

To solve the problem that the holes are formed between the pixel-defining layer 50 around the anode layer 234a and the sidewall of the anode layer 234a, an embodiment of the present disclosure provides a second optional implementation as follows.

In the second operational implementation, forming the conductive pattern and the pixel-defining layer on the substrate may include the following steps.

In step A2, a first conductive film, a second conductive film, and a third conductive film are sequentially formed on the substrate.

For step A2, reference may be made to the foregoing step A1, and the details are not repeated herein in the embodiment of the present disclosure.

In step B2, a first photoresist pattern is formed on the third conductive film.

For step B2, reference may be made to the foregoing step B1, and the details are not repeated herein in this embodiment of the present disclosure.

In step C2, a first conductive sub-pattern is acquired by performing a first etching process on the third conductive film.

For step C2, reference may be made to the foregoing step C1, and the details are not repeated herein in this embodiment of the present disclosure.

In step D2, a second conductive sub-pattern is acquired by performing a second etching process on the second conductive film. The second conductive sub-pattern may include: a second sub-anode.

For step D2, reference may be made to the foregoing step D1, and the details are not repeated herein in this embodiment of the present disclosure.

In step E2, a second photoresist pattern is acquired by performing an ashing process on the first photoresist pattern to remove an edge portion in the first photoresist pattern.

For step E2, reference may be made to the foregoing step E1, and the details are not repeated herein in this embodiment of the present disclosure.

In step F2, a third conductive sub-pattern is acquired by performing a third etching process on the first conductive sub-pattern. The third conductive sub-pattern includes: the second protective electrode and the third sub-anode.

For step F2, reference may be made to the foregoing step F1, and the details are not repeated herein in this embodiment of the present disclosure.

In step G2, a fourth conductive sub-pattern is acquired by performing a fourth etching process on the first conductive film. The fourth conductive sub-pattern includes: the first protective electrode and the first sub-anode.

For step G2, reference may be made to the foregoing step G1, and the details are not repeated herein in this embodiment of the present disclosure.

In step H2, the second photoresist pattern is removed.

Figure 15:
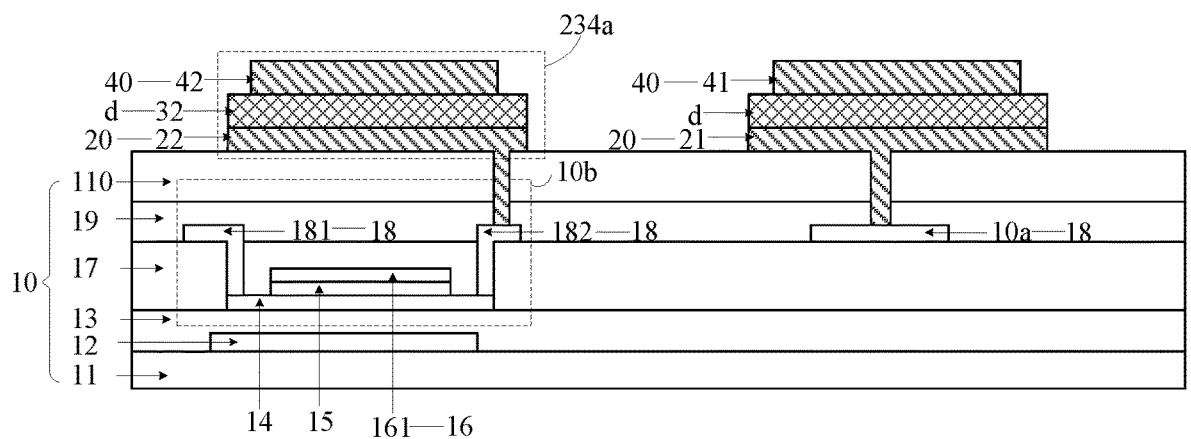
FIG. 15 is a schematic diagram illustrating another removal of the second photoresist pattern according to an embodiment of the present disclosure.

Please refer to FIG. 15, which is a schematic diagram illustrating another removal of the second photoresist pattern according an embodiment of the present disclosure. A stripping process may be performed on the second photoresist pattern. After the second photoresist pattern is removed, the anode layer 234a may be obtained on the substrate 10. In the anode layer 234a, a third orthographic projection of the third sub-anode 42 on the substrate 10 may be within a fourth orthographic projection of the second sub-anode 32 on the substrate 10, and an outer boundary of the third orthographic projection is staggered from an outer boundary of the fourth orthographic projection. In an exemplary embodiment, the third orthographic projection of the third sub-anode 42 on the substrate 10 may be in a central region of the fourth orthographic projection of the second sub-anode 32 on the substrate 10. In the anode layer 234a, an outer boundary of a fifth orthographic projection of the first sub-anode 22 on the substrate 10 may coincide with the outer boundary of the fourth orthographic projection of the second sub-anode 32 on the substrate 10. In this case, in the anode layer 234a, the area of the fourth orthographic projection of the second sub-anode 32 on the substrate 10 is the same as that of the fifth orthographic projection of the first sub-anode 22 on the substrate 10, and the area of the third orthographic projection of the third sub-anode 42 on the substrate 10 is smaller than the area of the fourth orthographic projection of the second sub-anode 32 on the substrate 10.

In step I2, a pixel-defining layer is formed on the third conductive sub-pattern.

Figure 16:
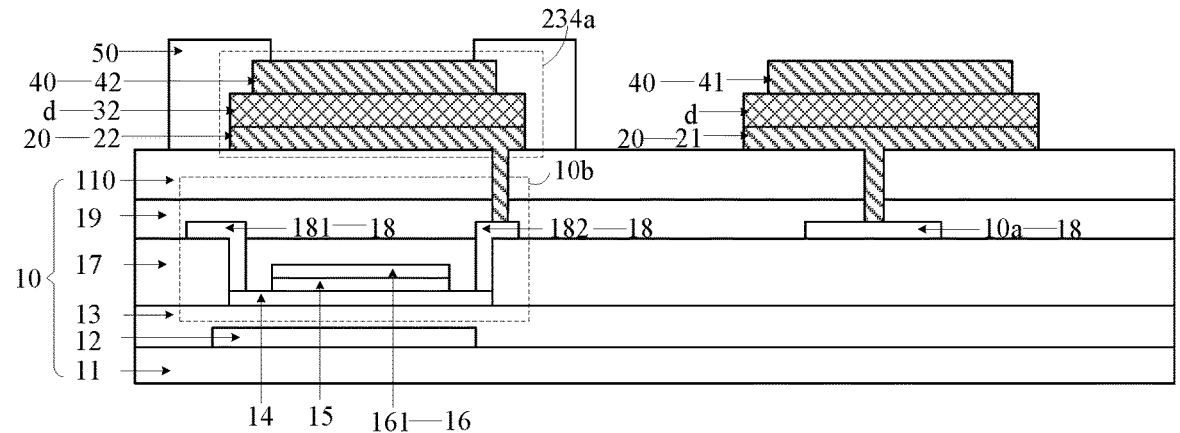
FIG. 16 is a schematic diagram illustrating another formation of the pixel-defining layer according to an embodiment of the present disclosure.

Please refer to FIG. 16, which is a schematic diagram illustrating another formation of the pixel-defining layer according to an embodiment of the present disclosure. A pixel-defining layer film is formed on the substrate 10 on which the third conductive sub-pattern 40 is formed, by any one of deposition, coating, and sputtering and the like, and then a one-time patterning process is performed on the pixel-defining layer film, to form the pixel-defining layer 50. The one-time patterning process may include: photoresist coating, exposure, developing, etching, and photoresist stripping. The pixel-defining layer 50 at least covers a portion of the second sub-anode 32 which is not in contact with the third sub-anode 42 in the anode layer 234a, and the pixel-defining layer 50 is staggered from the auxiliary electrode layer which is subsequently formed.

In the embodiment of the present disclosure, in the anode layer 234a, the area of the third orthographic projection of the third sub-anode 42 on the substrate 10 is smaller than the area of the fourth orthographic projection of the second sub-anode 32 on the substrate 10, and the area of the fourth orthographic projection is the same as the area of the fifth orthographic projection of the first sub-anode 22 on the substrate 10. Therefore, no groove is formed in the sidewall of the anode layer 234a, such that after the pixel-defining layer 50 is formed, no hole is formed between the pixel-defining layer 50 and the sidewall of the anode layer 234a, which ensures a better display effect of the display panel which is subsequently fabricated.

In step J2, a fifth conductive sub-pattern is acquired by performing an over-etching process on the second conductive sub-pattern.

Figure 17:
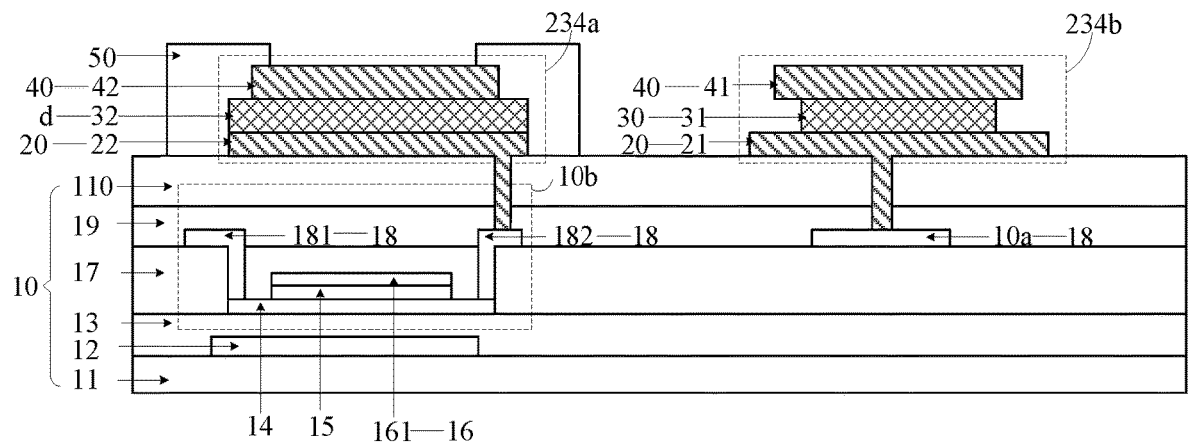
FIG. 17 is a schematic diagram illustrating another formation of the fifth conductive sub-pattern according to an embodiment of the present disclosure.

Please refer to FIG. 17, which is a schematic diagram illustrating another formation of the fifth conductive sub-pattern according to an embodiment of the present disclosure. The second conductive sub-pattern with the third conductive sub-pattern 40 may be over-etched to form the fifth conductive sub-pattern 30. The fifth conductive sub-pattern 30 includes: a metal electrode 31.

In an exemplary embodiment, an etching solution for etching a metallic material may be used for etching the second conductive sub-pattern, to remove portions that are not covered by the third conductive sub-pattern 40. Afterwards, the etching duration may be increased properly to achieve the over-etching process on the second conductive sub-pattern, to form the fifth conductive sub-pattern 30. The fifth conductive sub-pattern 30 includes: a metal electrode 31. As such, the first protective electrode 21 and the second protective electrode 41 both extend over the metal electrode 31 in the direction parallel to the substrate 10.

A conductive pattern including the anode layer 234a and the auxiliary electrode layer 234b may be formed on the substrate 10 by the above-mentioned steps A2 to J2. The anode layer 234a includes: a first sub-anode 22, a second sub-anode 32 and a third sub-anode 42. The auxiliary electrode layer 234b includes: a first protective electrode 21, a metal electrode 31 and a second protective electrode 41.

It should be noted that as the pixel-defining layer 50 is staggered from the auxiliary electrode layer 234b, the pixel-defining layer 50 does not affect the over-etching process performed on the second conductive sub-pattern in step J2.

It should also be noted that the pixel-defining layer 50 at least covers a portion of the second sub-anode 32 which is not in contact with the third sub-anode 42 in the anode layer 234a. Therefore, in the over-etching process that is performed on the second conductive sub-pattern in step J2, the second sub-anode 32 is not etched by the etching solution used for etching the metallic material, thereby preventing holes from being formed between the pixel-defining layer 50 and the sidewall of the anode layer 234a.

In the embodiment of the present disclosure, the pixel-defining layer 50 may further cover the edge portion of the third sub-anode 42, such that the pixel-defining layer 50 may protect the second sub-anode 32 and prevent the second sub-anode 32 from being etched in the over-etching process that is performed on the second conductive sub-pattern.

In the present disclosure, in the auxiliary electrode layer 234b in the conductive pattern formed by the above two optional implementations, the second orthographic projection of the second protective electrode 41 on the substrate 10 may be within the first orthographic projection of the first protective electrode 21 on the substrate 10, and the outer boundary of the second orthographic projection is staggered from the outer boundary of the first orthographic projection. The second orthographic projection of the second protective electrode 41 on the substrate 10 may be within the central region of the first orthographic projection of the first protective electrode 21 on the substrate 10. The sixth orthographic projection of the metal electrode 31 on the substrate 10 may be within the central region of the first orthographic projection of the first protective electrode 21 on the substrate 10.

In step 203, a light-emitting layer is formed on the pixel-defining layer.

Optionally, materials of the light-emitting layer may include phosphorescent or fluorescent light-emitting materials.

Figure 18:
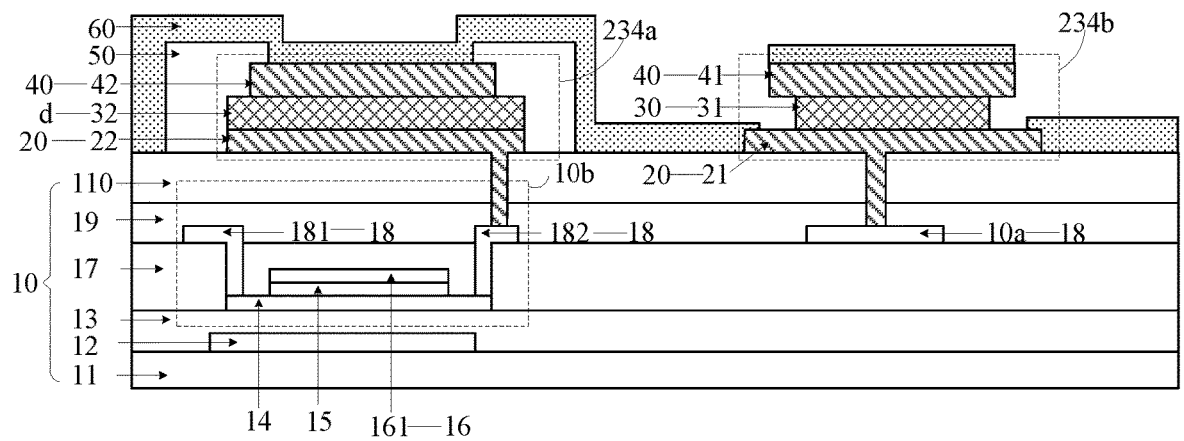
FIG. 18 is a schematic diagram illustrating formation of a light-emitting layer on the pixel-defining layer according to an embodiment of the present disclosure.

Please refer to FIG. 18, which is a schematic diagram illustrating the formation of the light-emitting layer on the pixel-defining layer according to an embodiment of the present disclosure. The light-emitting layer 60 may be formed by an evaporation process on the substrate 10 on which the pixel-defining layer 50 is formed. In the auxiliary electrode layer 234b, the first protective electrode 21 and the second protective electrode 41 both extend over the metal electrode 31 in the direction parallel to the substrate 10. Therefore, when the light-emitting layer 60 is formed on the pixel-defining layer 50 by the evaporation process, the light-emitting layer 60 may be partitioned by auxiliary electrode layer 234b. That is, the portion, on the auxiliary electrode layer 234b, of the light-emitting layer 60 is disconnected from other portions of the light-emitting layer 60.

In step 204, a cathode layer is formed on the light-emitting layer.

Optionally, the material of the cathode layer may include ITO or IZO.

Figure 19:
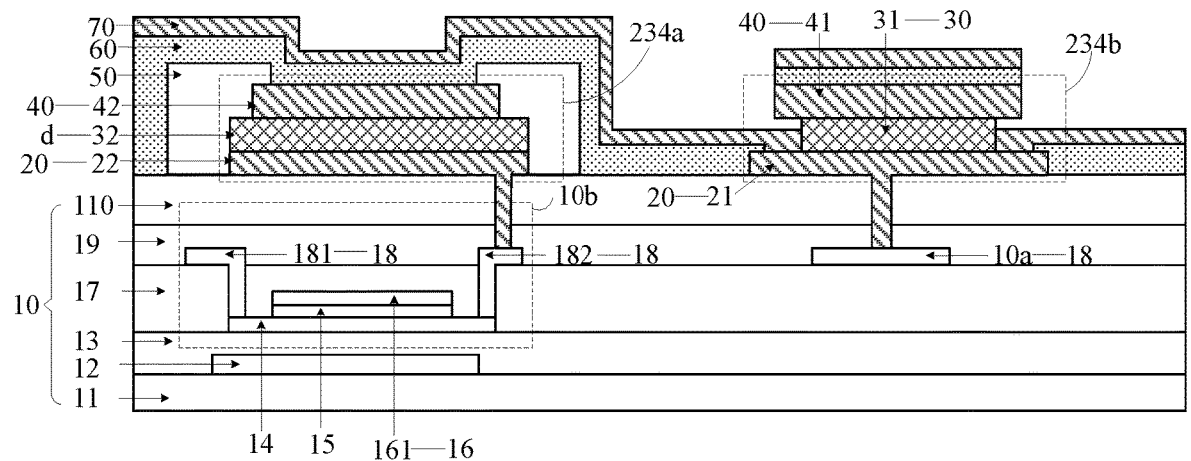
FIG. 19 is a schematic diagram illustrating formation of a cathode layer on the light-emitting layer according to an embodiment of the present disclosure.

Please refer to FIG. 19, which is a schematic diagram illustrating the formation of a cathode layer on the light-emitting layer according to an embodiment of the present disclosure. The cathode layer 70 may be formed by a sputtering process on the substrate 10 on which the light-emitting layer 60 is formed, such that the formed cathode layer 70 is in contact with the first protective electrode 21 in the auxiliary electrode layer 234b and is in contact with the sidewall of the metal electrode 31 in the auxiliary electrode layer 234b.

In the present disclosure, the film layer formed by the sputtering process has better diffusibility, and the light-emitting layer 60 is partitioned by the auxiliary electrode layer 234b. Therefore, when the cathode layer 70 is formed by the sputtering process, the cathode layer 70 may be in contact with the sidewall of the metal electrode 401 in the auxiliary electrode layer 234b.

It should be noted that the pixel-defining layer 50 formed in step 202 may define a plurality of pixel regions on the substrate 10 and non-pixel regions outside the pixel regions. The anode layer 234a in the conductive pattern is disposed in the pixel regions, and the auxiliary electrode layer 234b in the conductive pattern is disposed in the non-pixel regions. The light-emitting layer 60 and the cathode layer 70 may be disposed in the pixel regions or in the non-pixel regions. In the present disclosure, the portions, in the pixel regions, of the anode layer 234a and the cathode layer 70, and the portions, in the pixel regions, of the light-emitting layer 60 may form light-emitting devices. In the embodiments of the present disclosure, there are a plurality of light-emitting devices in the display panel, the plurality of light-emitting devices may correspond to the plurality of pixel regions one-to-one, and each light-emitting device may be disposed in a corresponding pixel region.

In step 205, an encapsulation layer is formed on the cathode layer.

Figure 20:
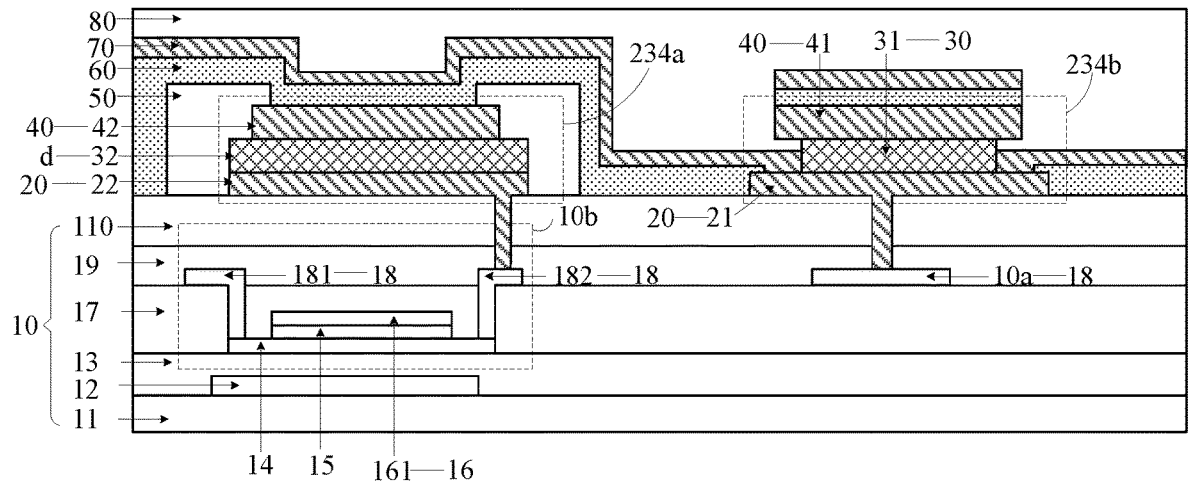
FIG. 20 is a schematic diagram illustrating formation of an encapsulation layer on the cathode layer according to an embodiment of the present disclosure.

Please refer to FIG. 20, which is a schematic diagram illustrating the formation of an encapsulation layer on the cathode layer according to an embodiment of the present disclosure. The encapsulation layer 80 may be formed by a sputtering process on the substrate 10 on which the cathode layer 70 is formed. The encapsulation layer 80 is configured to encapsulate the light-emitting devices in the display panel, to isolate the light-emitting devices from outside air, thereby preventing the light-emitting layer 60 from being corroded by moisture, oxygen and the like in the air.

It should be noted that the sequence of the steps in the method for manufacturing the display panel according to the embodiments of the present disclosure can be adjusted properly, and the steps may also be added or removed as required. In the technical scope disclosed by the present disclosure, any variation to the method readily conceivable to persons skilled in the art shall fall within the protection scope of the present disclosure, which is not repeated herein.

In summary, the method for manufacturing a display panel according to the embodiments of the present disclosure includes: sequentially forming the conductive pattern, the light-emitting layer, and the cathode layer on the substrate. The conductive pattern may include the auxiliary electrode layer, and the auxiliary electrode layer includes: the first protective electrode, the metal electrode and the second protective electrode which are laminated in the direction that is perpendicular to and away from the substrate. The second protective electrode and the first protective electrode both extend over the metal electrode in the direction parallel to the substrate. Therefore, when the light-emitting layer is formed on the second protective electrode, the light-emitting layer is only attached to the second protective electrode and the edge area of the first protective electrode, so that the cathode layer which is subsequently formed may be in contact with the sidewall of the metal electrode and the first protective electrode. Thus, effective overlapping between the cathode layer and the auxiliary electrode layer can be achieved, and the fact that the cathode layer and the auxiliary electrode layer cannot be normally overlapped due to the attachment of the light-emitting layer to the auxiliary electrode layer is avoided. The electrical connection performance between the cathode layer and the auxiliary electrode layer is effectively improved, so that the display panel achieves a better display effect. Meanwhile, the auxiliary electrode layer is formed through the one-time patterning process, and only one mask is required in the process of forming the auxiliary electrode layer, which effectively reduces the cost in developing and manufacturing the mask. Thus, the manufacturing process of the auxiliary electrode layer is effectively simplified and the difficulty in manufacturing the display panel is low.

An embodiment of the present disclosure further provides a display panel, which is manufactured by using the method for manufacturing the display panel as shown in FIG. 2 or FIG. 3. In an exemplary embodiment, as shown in FIG. 20, the display panel includes: a substrate 10, and a conductive pattern, a light-emitting layer 60 and a cathode layer 70, which are laminated on the substrate in a direction that is away from and perpendicular to the substrate 10, The conductive pattern includes: an auxiliary electrode layer 234b. The auxiliary electrode layer 234b includes: a first protective electrode 21, a metal electrode 31, and a second protective electrode 41, which are laminated in the direction that is perpendicular to and away from the substrate 10. The first protective electrode 21 and the second protective electrode 41 both extend over the metal electrode 31 in the direction parallel to the substrate 10.

In the anode layer 234b in the conductive pattern, a second orthographic projection of the second protective electrode 41 on the substrate 10 is within a first orthographic projection of the first protective electrode 21 on the substrate 10, and an outer boundary of the second orthographic projection is staggered from an outer boundary of the first orthographic projection. In an exemplary embodiment, the second orthographic projection of the second protective electrode 41 on the substrate 10 is within a central region of the first orthographic projection of the first protective electrode 21 on the substrate 10. In the present disclosure, a sixth orthographic projection of the metal electrode 31 on the substrate 10 may be within the central region of the first orthographic projection of the first protective electrode 21 on the substrate 10.

In an embodiment of the present disclosure, the cathode layer 70 is in contact with the first protective electrode 21 and is in contact with a sidewall of the metal electrode 31.

Optionally, the conductive pattern may further include: an anode layer 234a. The anode layer 234a may include: a first sub-anode 22, a second sub-anode 32 and a third sub-anode 42 which are sequentially laminated in the direction that is perpendicular to and away from the substrate 10. The first sub-anode 22 may be made of the same material as the first protective electrode 21; the second sub-anode 32 may be made of the same material as the metal electrode 31; and the third sub-anode 42 may be made of the same material as the second protective electrode 41.

It should be noted that the conductive pattern in the embodiment of the present disclosure is formed through the one-time patterning process. For the process of forming the conductive pattern through the one-time patterning process, reference may be made to the corresponding content in the above-mentioned embodiments, the details of which are not repeated herein.

Optionally, in the anode layer 234a in the conductive pattern, a third orthographic projection of the third sub-anode 42 on the substrate 10 may be within a fourth orthographic projection of the second sub-anode 32 on the substrate 10. Moreover, an outer boundary of the third orthographic projection is staggered from an outer boundary of the fourth orthographic projection. In an exemplary embodiment, the third orthographic projection of the third sub-anode 42 on the substrate 10 may be within the central region of the fourth orthographic projection of the second sub-anode 32 on the substrate 10. In the present disclosure, the outer boundary of the fifth orthographic projection of the first sub-anode 22 on the substrate 10 may coincide with the outer boundary of the fourth orthographic projection of the second sub-anode 32 on the substrate 10.

In an embodiment of the present disclosure, the display panel may further include: a pixel-defining layer 50 disposed on the substrate 10. The pixel-defining layer 50 at least covers a portion, which is not in contact with the third sub-anode 42, of the second sub-anode 32, and the pixel-defining layer 50 is staggered from the auxiliary electrode layer 234b. In this case, no holes are formed between the pixel-defining layer 50 and the sidewall of the anode layer 234a, which can ensure a better display effect of the display panel.

In an exemplary embodiment, the pixel-defining layer 50 further covers the edge portion of the third sub-anode 42, such that the pixel-defining layer 50 may effectively protect the second sub-anode 32, to prevent the second sub-anode 32 from being etched in the process of forming the metal electrode 31 in the auxiliary electrode layer 234b.

Optionally, the materials of the first protective electrode 21 and the second protective electrode 41 in the auxiliary electrode layer 234b both include: ITO or IZO.

Optionally, the substrate 10 may include: a pixel drive circuit electrically connected to the anode layer 234a, and a cathode signal line electrically connected to the auxiliary electrode layer 234b.

Optionally, the display panel may further include: an encapsulation layer 80 disposed on a side of the cathode layer 70 away from the substrate 10.

Figure 21:
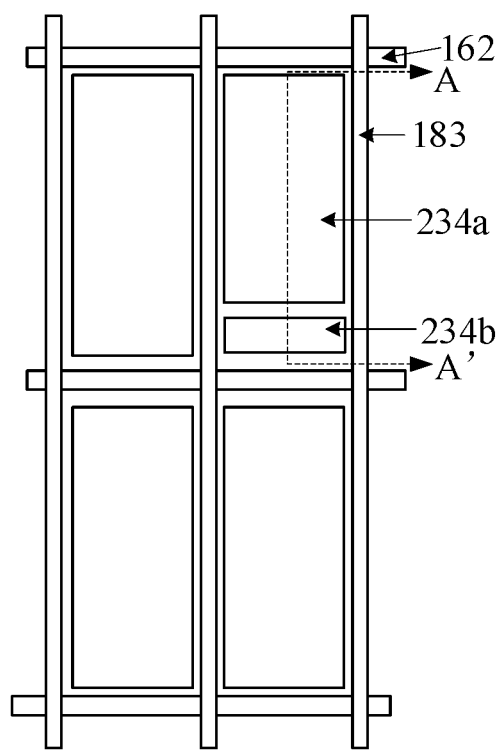
FIG. 21 is a top view of a display panel according to an embodiment of the present disclosure.

Optionally, please refer to FIG. 21, which is a top view of a display panel according to an embodiment of the present disclosure. In FIG. 21, for the cross-sectional view of the display panel 00 at A-A', reference may be made to the schematic diagram of the film layer structure of the display panel shown in FIG. 20. In the display panel 00, the extension direction of a gate line 162 may be perpendicular to the extension direction of a data line 183.

In the embodiments of the present disclosure, the number and arrangement of the auxiliary electrode layer 234b in the display panel may be determined based on the resistance of the cathode layer 70. For example, one auxiliary electrode layer 234b may be provided among every 2×2 pixels; or, one auxiliary electrode layer 234b may be provided among every 3×3 pixels.

Persons skilled in the art may clearly understand that for the convenience and brevity of description, reference may be made to the corresponding content in the forgoing embodiments of the method for manufacturing the display panel for the principle of components in the display panel described above, the details of which are not repeated herein.

An embodiment of the present disclosure further provides a display apparatus, which may include: a power supply component and a display panel. The power supply component is configured to supply power to the display panel.

The display panel includes: a substrate; and a conductive pattern, a light-emitting layer and a cathode layer, which are laminated on the substrate in a direction that is perpendicular to and away from the substrate, The conductive pattern is formed by a one-time patterning process, and the conductive pattern includes an auxiliary electrode layer. The auxiliary electrode layer includes a first protective electrode, a metal layer and a second protective electrode which are laminated in the direction that is away from the substrate. The first protective electrode and the second protective electrode both extend over the metal electrode in the direction parallel to the substrate. The second orthographic projection of the second protective electrode on the substrate is within the first orthographic projection of the first protective electrode on the substrate, and the outer boundary of the second orthographic projection is staggered from the outer boundary of the first orthographic projection. The cathode layer is in contact with the first protective electrode and is in contact with the sidewall of the metal electrode.

In an exemplary embodiment, reference may be made to FIG. 20 for the film layer structure of the display panel. The display apparatus may be any product or component with a display function, such as a mobile phone, a tablet computer, a television, a display, a notebook computer, a digital photo frame, and a navigator.

It should be noted that in the drawings, the size of layers and regions may be exaggerated for clarity of illustration. Moreover, it's to be understood that when an element or layer is referred to as being "on" another element or layer, the element or layer may be directly on the other element or an intermediate layer may be present. In addition, it is to be understood that when an element or layer is referred to as being "under" another element or layer, the element or layer may be directly under the other element, or more than one intermediate layer or element may be present. In addition, it is to be further understood that when a layer or element is referred to as being "between" two layers or two elements, the layer or element may be a unique layer between the two layers or two elements, or more than one intermediate layer or element may be present. Similar reference numerals indicate similar elements throughout the whole text.

In the present disclosure, the terms "first" and "second" are for descriptive purposes only and shall not be construed as indicating or implying relative importance. The term "a plurality of" refers to two or more, unless otherwise explicitly specified.

The foregoing descriptions are merely optional embodiments of the present disclosure, and are not intended to limit the present disclosure. Within the spirit and principles of the disclosure, any modifications, equivalent substitutions, improvements and the like shall fall within the protection scope of the present disclosure.

What is claimed is:
1. A display panel, comprising:
a substrate; and
a conductive pattern, a light-emitting layer and a cathode layer which are laminated on the substrate in a direction that is perpendicular to and away from the substrate,
wherein the conductive pattern is formed by a one-time patterning process, and the conductive pattern comprises an auxiliary electrode layer, the auxiliary electrode layer comprising a first protective electrode, a metal electrode and a second protective electrode which are laminated in the direction that is perpendicular to and away from the substrate, wherein the first protective electrode and the second protective electrode both extend over the metal electrode in a direction parallel to the substrate, a second orthographic projection of the second protective electrode on the substrate is within a first orthographic projection of the first protective electrode on the substrate, and an outer boundary of the second orthographic projection is staggered from an outer boundary of the first orthographic projection; and
the cathode layer is in contact with the first protective electrode and a sidewall of the metal electrode;
wherein the conductive pattern further comprises an anode layer, the anode layer comprising a first sub- anode, a second sub-anode and a third sub-anode which are sequentially laminated in a direction away from the substrate; and wherein a third orthographic projection of the third sub-anode on the substrate is within a fourth orthographic projection of the second sub-anode on the substrate, and an outer boundary of the third orthographic projection is staggered from an outer boundary of the fourth orthographic projection.

2. The display panel according to claim 1, wherein a material of the first sub-anode is the same as that of the first protective electrode, a material of the second sub-anode is the same as that of the metal electrode, and a material of the third sub-anode is the same as that of the second protective electrode.

3. The display panel according to claim 1, further comprising: a pixel-defining layer on the substrate, wherein the pixel-defining layer at least covers a portion of the second sub-anode that is not in contact with the third sub-anode, and the pixel-defining layer is staggered from the auxiliary electrode layer.

4. The display panel according to claim 3, wherein the pixel-defining layer further covers an edge portion of the third sub-anode.

5. The display panel according to claim 1, wherein the third orthographic projection is within a central region of the fourth orthographic projection, and an outer boundary of a fifth orthographic projection of the first sub-anode on the substrate coincides with the outer boundary of the fourth orthographic projection.

6. The display panel according to claim 1, wherein the second orthographic projection is within a central region of the first orthographic projection, and a sixth orthographic projection of the metal electrode on the substrate is within the central region of the first orthographic projection.

7. The display panel according to claim 1, wherein a material of the first protective electrode and a material of second protective electrode both comprises: indium tin oxide or indium zinc oxide.

8. The display panel according to claim 1, wherein the substrate comprises: a pixel drive circuit electrically connected to the anode layer, and a cathode signal line electrically connected to the auxiliary electrode layer.

9. The display panel according to claim 8, further comprising: an encapsulation layer on a side of the cathode layer away from the substrate.

10. A display apparatus, comprising: a power supply component and a display panel, wherein the power supply component is configured to supply power to the display panel, and the display panel comprises:
a substrate; and
a conductive pattern, a light-emitting layer and a cathode layer which are laminated on the substrate in a direction that is perpendicular to and away from the substrate,
wherein the conductive pattern is formed by a one-time patterning process, and the conductive pattern comprises an auxiliary electrode layer, the auxiliary electrode layer comprising a first protective electrode, a metal electrode and a second protective electrode which are laminated in a direction that is away from the substrate, wherein the first protective electrode and the second protective electrode both extend over the metal electrode in a direction parallel to the substrate, a second orthographic projection of the second protective electrode on the substrate is within a first orthographic projection of the first protective electrode on the substrate, and an outer boundary of the second orthographic projection is staggered from an outer boundary of the first orthographic projection; and
the cathode layer is in contact with the first protective electrode and a sidewall of the metal electrode;
wherein the conductive pattern further comprises an anode layer, the anode layer comprising a first sub-anode, a second sub-anode and a third sub-anode which are sequentially laminated in a direction away from the substrate; and
wherein a third orthographic projection of the third sub-anode on the substrate is within a fourth orthographic projection of the second sub-anode on the substrate, and an outer boundary of the third orthographic projection is staggered from an outer boundary of the fourth orthographic projection.

11. A method for manufacturing a display panel, comprising:
forming a conductive pattern on a substrate by a one-time patterning process, wherein the conductive pattern comprises an auxiliary electrode layer, the auxiliary electrode layer comprising a first protective electrode, a metal electrode and a second protective electrode which are laminated in a direction that is perpendicular to and away from the substrate, wherein the first protective electrode and the second protective electrode both extend over the metal electrode in a direction parallel to the substrate, a second orthographic projection of the second protective electrode on the substrate is within a first orthographic projection of the first protective electrode on the substrate, and an outer boundary of the second orthographic projection is staggered from an outer boundary of the first orthographic projection;
laminating a light-emitting layer on the conductive pattern in the direction that is perpendicular to and away from the substrate; and
laminating a cathode layer on the light-emitting layer in the direction that is perpendicular to and away from the substrate, wherein the cathode layer is in contact with the first protective electrode and a sidewall of the metal electrode;
wherein the conductive pattern further comprises an anode layer, the anode layer comprising a first sub-anode, a second sub-anode and a third sub-anode which are sequentially laminated in a direction away from the substrate; and
wherein a third orthographic projection of the third sub-anode on the substrate is within a fourth orthographic projection of the second sub-anode on the substrate, and an outer boundary of the third orthographic projection is staggered from an outer boundary of the fourth orthographic projection.

12. The method according to claim 11, wherein forming the conductive pattern on the substrate by the one-time patterning process comprises:
sequentially forming a first conductive film, a second conductive film, and a third conductive film on the substrate;
forming a first photoresist pattern on the third conductive film;
acquiring a first conductive sub-pattern by performing a first etching process on the third conductive film;
acquiring a second conductive sub-pattern by performing a second etching process on the second conductive film;

acquiring a second photoresist pattern by performing an ashing process on the first photoresist pattern to remove an edge portion in the first photoresist pattern;

acquiring a third conductive sub-pattern by performing a third etching process on the first conductive sub-pattern, wherein the third conductive sub-pattern comprises the second protective electrode;

acquiring a fourth conductive sub-pattern by performing a fourth etching process on the first conductive film, wherein the fourth conductive sub-pattern comprises the first protective electrode; and acquiring a fifth conductive sub-pattern by performing an over-etching process on the second conductive sub-pattern, wherein the fifth conductive sub-pattern comprises the metal electrode.

13. The method according to claim 12, wherein acquiring the second photoresist pattern by performing the ashing process on the first photoresist pattern to remove the edge portion in the first photoresist pattern comprises:

acquiring the second photoresist pattern by placing the substrate on which the first photoresist pattern is formed in an environment containing an ashing gas, such that the ashing gas reduces a thickness of the first photoresist pattern and removes the edge portion of the first photoresist pattern, wherein the ashing gas is used to react with a photoresist material in the first photoresist pattern.

14. The method according to claim 13, wherein the ashing gas comprises any one of the followings:

oxygen; and a mixed gas of oxygen and sulfur hexafluoride.

15. The method according to claim 12, wherein before acquiring the fifth conductive sub-pattern by performing an over-etching process on the second conductive sub-pattern, the method further comprises:

removing the second photoresist pattern; and forming a pixel-defining layer on the third conductive sub-pattern, wherein the fourth conductive sub-pattern further comprises the first sub-anode, the second conductive sub-pattern comprises the second sub-anode, the third conductive sub-pattern further comprises the third sub-anode; and the pixel-defining layer at least covers a portion of the second sub-anode that is not in contact with the third sub-anode, and the pixel-defining layer is staggered from the auxiliary electrode layer.

16. The method according to claim 12, wherein forming the first photoresist pattern on the third conductive film comprises:

forming a photoresist film on the third conductive film; and acquiring the first photoresist pattern by exposing and developing the photoresist film.

17. The method according to claim 11, wherein forming the cathode layer on the light-emitting layer comprises:

forming the cathode layer on the light-emitting layer by a sputtering process.

18. The method according to claim 11, wherein forming the light-emitting layer on the conductive pattern comprises:

forming the light-emitting layer on the conductive pattern by an evaporation process.

19. The method according to claim 11, wherein after forming the cathode layer on the light-emitting layer, the method further comprises:

forming an encapsulation layer on the cathode layer.

\* \* \* \* \*